United States Patent
Ishii et al.

(10) Patent No.: US 8,760,815 B2
(45) Date of Patent: Jun. 24, 2014

(54) WIRED CIRCUIT BOARD

(75) Inventors: Jun Ishii, Osaka (JP); Takahiko Yokai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1135 days.

(21) Appl. No.: 12/149,903

(22) Filed: May 9, 2008

(65) Prior Publication Data

US 2008/0278858 A1    Nov. 13, 2008

Related U.S. Application Data

(60) Provisional application No. 60/924,588, filed on May 22, 2007.

(30) Foreign Application Priority Data

May 10, 2007   (JP) ................. 2007-125899

(51) Int. Cl.
  *G11B 5/48*    (2006.01)
  *H05K 1/02*    (2006.01)
  *H05K 1/05*    (2006.01)
  *H05K 3/46*    (2006.01)

(52) U.S. Cl.
  CPC ...... *H05K 1/0253* (2013.01); *H05K 2201/0969* (2013.01); *H05K 1/056* (2013.01); *G11B 5/484* (2013.01); *H05K 2201/09081* (2013.01); *H05K 1/028* (2013.01); *H05K 3/4644* (2013.01); *G11B 5/486* (2013.01); *H05K 2201/09318* (2013.01); *H05K 2201/093* (2013.01); *H05K 1/0278* (2013.01); *H05K 2201/09663* (2013.01)
  USPC .................... 360/245.8; 360/245.9

(58) Field of Classification Search
  USPC ........................... 360/245.8–245.9
  See application file for complete search history.

(56) References Cited

U.S. PATENT DOCUMENTS

| | | | |
|---|---|---|---|
| 5,608,591 | A | 3/1997 | Klaassen |
| 5,612,512 | A | 3/1997 | Wakamatsu et al. |
| 5,666,717 | A | 9/1997 | Matsumoto et al. |
| 5,709,957 | A | 1/1998 | Chiang et al. |
| 5,796,552 | A | 8/1998 | Akin, Jr. et al. |
| 5,812,344 | A | 9/1998 | Balakrishnan |

(Continued)

FOREIGN PATENT DOCUMENTS

| | | |
|---|---|---|
| CN | 1112877 | 12/1995 |
| CN | 1339822 | 3/2002 |

(Continued)

OTHER PUBLICATIONS

Notification of Reasons for Refusal, issued by the Japanese Patent Office on Jun. 4, 2013 in connection with JP2012-060830.

*Primary Examiner* — Wayne Young
*Assistant Examiner* — Carlos E Garcia
(74) *Attorney, Agent, or Firm* — Jean C. Edwards, Esq.; Edwards Neils PLLC

(57) ABSTRACT

The wired circuit board includes a metal supporting board, a metal foil formed on the metal supporting board, a first insulating layer formed on the metal supporting board so as to cover the metal foil, and a conductive pattern formed on the first insulating layer and having a plurality of wires. The metal foil is arranged along a lengthwise direction of each of the wires so as not to be opposed to part of the wires in a thickness direction and so as to be opposed to a remainder of the wires in the thickness direction.

3 Claims, 6 Drawing Sheets

(56) References Cited

U.S. PATENT DOCUMENTS

| | | | |
|---|---|---|---|
| 5,857,257 A | 1/1999 | Inaba | |
| 5,862,010 A * | 1/1999 | Simmons et al. | 360/97.01 |
| 5,995,329 A | 11/1999 | Shiraishi et al. | |
| 6,096,482 A * | 8/2000 | Omote et al. | 430/311 |
| 6,100,582 A | 8/2000 | Omote et al. | |
| 6,147,876 A | 11/2000 | Yamaguchi et al. | |
| 6,162,996 A * | 12/2000 | Schmidt et al. | 174/259 |
| 6,242,103 B1 | 6/2001 | Farnworth et al. | |
| 6,399,899 B1 * | 6/2002 | Ohkawa et al. | 174/261 |
| 6,480,359 B1 | 11/2002 | Dunn et al. | |
| 6,602,584 B2 | 8/2003 | Jo et al. | |
| 6,735,052 B2 | 5/2004 | Dunn et al. | |
| 7,013,561 B2 | 3/2006 | Nakatani et al. | |
| 7,067,912 B2 | 6/2006 | Takeuchi et al. | |
| 7,182,606 B2 * | 2/2007 | Ishii et al. | 439/66 |
| 7,319,573 B2 | 1/2008 | Nishiyama | |
| 8,134,080 B2 * | 3/2012 | Ishii et al. | 174/255 |
| 2002/0007961 A1 | 1/2002 | Yamato et al. | |
| 2002/0074662 A1 | 6/2002 | Hong et al. | |
| 2002/0100609 A1 | 8/2002 | Ookawa et al. | |
| 2003/0045024 A1 | 3/2003 | Shimoto et al. | |
| 2004/0065717 A1 | 4/2004 | Saijo et al. | |
| 2004/0173375 A1 | 9/2004 | Lee et al. | |
| 2004/0245015 A1 | 12/2004 | Yoshimi et al. | |
| 2004/0245619 A1 | 12/2004 | Takeuchi | |
| 2004/0246626 A1 * | 12/2004 | Wakaki et al. | 360/245.8 |
| 2004/0252413 A1 | 12/2004 | Nishiyama | |
| 2005/0061542 A1 | 3/2005 | Aonuma et al. | |
| 2005/0122627 A1 | 6/2005 | Kanagawa et al. | |
| 2005/0186332 A1 | 8/2005 | Funada et al. | |
| 2005/0248885 A1 | 11/2005 | Funada et al. | |
| 2005/0254175 A1 | 11/2005 | Swanson et al. | |
| 2006/0199402 A1 | 9/2006 | Ishii et al. | |
| 2007/0017695 A1 | 1/2007 | Ishii et al. | |
| 2007/0041123 A1 * | 2/2007 | Swanson et al. | 360/122 |
| 2007/0133128 A1 | 6/2007 | Arai | |

FOREIGN PATENT DOCUMENTS

| | | |
|---|---|---|
| CN | 1469805 A | 1/2004 |
| EP | 1 592 290 | 2/2005 |
| JP | 59-219492 | 10/1984 |
| JP | 1-150390 | 6/1989 |
| JP | 3-274799 | 12/1991 |
| JP | 05-304345 | 11/1993 |
| JP | 07-202365 | 8/1995 |
| JP | 08-241894 | 9/1996 |
| JP | 8-307020 | 11/1996 |
| JP | 9-282624 | 10/1997 |
| JP | 10-163590 | 6/1998 |
| JP | 10-507028 | 7/1998 |
| JP | 2000-513861 | 10/2000 |
| JP | 2001-085842 | 3/2001 |
| JP | 2001-202731 | 7/2001 |
| JP | 2001-256627 | 9/2001 |
| JP | 2002-57437 | 2/2002 |
| JP | 2002-111205 | 4/2002 |
| JP | 2002-124767 | 4/2002 |
| JP | 2002-198462 | 7/2002 |
| JP | 2002-222578 | 8/2002 |
| JP | 2003-151114 | 5/2003 |
| JP | 2003-152404 | 5/2003 |
| JP | 2003-197459 | 7/2003 |
| JP | 2004-14975 | 1/2004 |
| JP | 2004-501511 | 1/2004 |
| JP | 2004-088020 | 3/2004 |
| JP | 2004-111578 | 4/2004 |
| JP | 2004-186342 | 7/2004 |
| JP | 2004-363205 | 12/2004 |
| JP | 2004-363331 | 12/2004 |
| JP | 2005-11387 | 1/2005 |
| JP | 2005-100488 | 4/2005 |
| JP | 2005-158973 | 6/2005 |
| JP | 2005-235318 | 9/2005 |
| JP | 2005-322336 | 11/2005 |
| JP | 2006-173399 | 6/2006 |
| JP | 2006-245220 | 9/2006 |
| JP | 2007-019261 | 1/2007 |
| JP | 2007-088056 | 4/2007 |
| JP | 2007164853 A | 6/2007 |
| WO | WO 01/86641 | 11/2001 |
| WO | WO 2005/083685 | 9/2005 |

* cited by examiner (a)

(b)

(c)

(d)

(e)

(f)

(g)

(h)

(i)

(j)

WIRED CIRCUIT BOARD

CROSS-REFERENCE TO RELATED APPLICATIONS

This patent application claims the benefit of U.S. Provisional Application No. 60/924,588, filed on May 22, 2007, and claims priority from Japanese Patent Application No. 2007-125899, filed on May 10, 2007, the contents of which are herein incorporated by reference in their entirety.

BACKGROUND OF THE INVENTION

1. Field of the Invention

The present invention relates to a wired circuit board. More particularly, the present invention relates to a wired circuit board such as a suspension board with circuit.

2. Description of Related Art

A suspension board with circuit used in a hard disk drive is a wired circuit board formed with a wired circuit pattern on a suspension board which supports a magnetic head via an insulating layer. In recent years, this suspension board with circuit has become widely available because a magnetic head keeps a minute gap from a magnetic disk against an airflow caused when the magnetic head and the magnetic disk travel relatively to each other, so that the magnetic head obtains a good floating posture.

Such suspension board with circuit is formed with a gimbal portion, wherein the gimbal portion include comprising a tongue portion for mounting a slider equipped with a magnetic head, and an outrigger portion arranged on both widthwise sides of the tongue portion and formed with a wired circuit pattern usually at a tip portion thereof. The rigidity of the outrigger portion is an important factor in order to precisely adjust a floating posture (angle) of the slider with respect to the magnetic disk.

Meanwhile, in recent years, there has been a need for a signal having a higher frequency in the suspension board with circuit from a viewpoint of a higher density data. However, the higher frequency causes higher transmission loss in a conductive pattern.

Therefore, a proposal has been made that transmission loss in a conductor is reduced, for example, by sequentially laminating a lower conductor, an insulating layer, and a conductor consisting of a record-side line and a reproduction-side line on a suspension (cf., Japanese Unexamined Patent Publication No. 2005-11387).

SUMMARY OF THE INVENTION

In recent years, however, along with downsizing of sliders, there has been a demand for more precise adjustment of a floating posture (angle) of a slider with respect to a magnetic disk.

As in the proposal of Japanese Unexamined Patent Publication No. 2005-11387, the lower conductor provided along the conductor increases a higher rigidity of the outrigger portion, thereby making it difficult to precisely adjust the floating posture (angle) of the slider.

It is an object of the present invention to provide a wired circuit board capable of improving the operability of mount components, while allowing to reduce transmission loss in a conductive pattern.

The wired circuit board of the present invention comprises a metal supporting board, a metal foil formed on the metal supporting board, a first insulating layer formed on the metal supporting board so as to cover the metal foil, and a conductive pattern formed on the first insulating layer and having a plurality of wires, in which the metal foil is arranged along a lengthwise direction of each of the wires so as not to be opposed to part of the wires in a thickness direction and so as to be opposed to a remainder of the wires in the thickness direction.

In the wired circuit board of the present invention, it is preferable that the metal supporting board is formed with an opening opposed to the part of the wires in the thickness direction.

In the wired circuit board of the present invention, it is preferable that the wired circuit board is a suspension board with circuit.

In the wired circuit board of the present invention, it is preferable that the metal supporting board is formed with an opening having a generally U-shape in plane view opposed to the part of the wires in the thickness direction, and comprises a tongue portion sandwiched by the opening and for mounting a magnetic head, and an outrigger portion arranged on the outer side of the opening.

In the wired circuit board of the present invention, it is preferable that the metal foil opposed to the wires has an area of 70% or more per 100% of the area of the wires.

It is preferable that the wired circuit board of the present invention further comprises a first metal thin film interposed between the metal foil and the metal supporting board.

It is preferable that the wired circuit board of the present invention further comprises a second insulating layer interposed between the first metal thin film and the metal supporting board.

According to the wired circuit board of the present invention, the metal foil is opposed to a remainder of the wires in the thickness direction, so that this simple layer structure allows reduction in the transmission loss in the conductive pattern.

On the other hand, the metal foil is not opposed to a part of the wires in the thickness direction, so that the rigidity of the corresponding part can be reduced. Therefore, when a mount component is mounted in the vicinity of such part, excellent operability can be ensured for the mount component.

As a result, excellent operability can be ensured, while achieving reduction in the transmission loss.

DETAILED DESCRIPTION OF PREFERRED EMBODIMENTS

Figure 1:
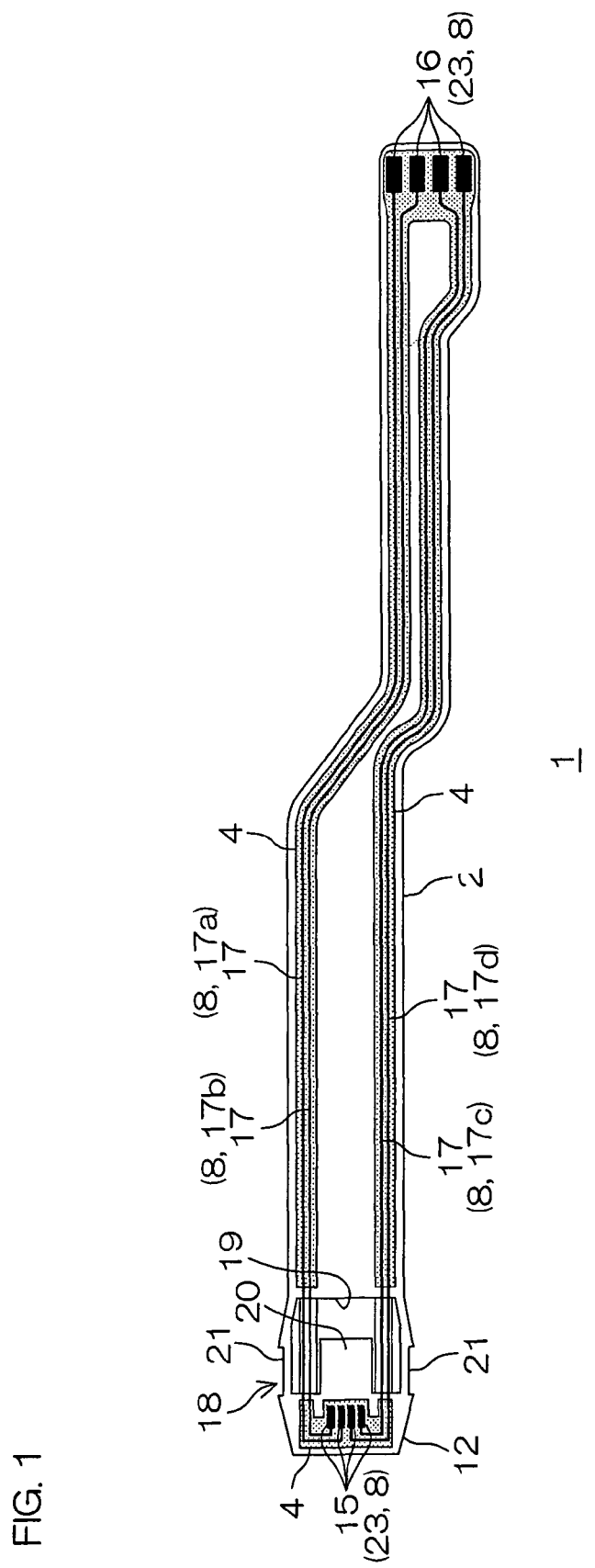
FIG. 1 is a plan view of a suspension board with circuit as an embodiment of a wired circuit board according to the present invention.
Figure 2:
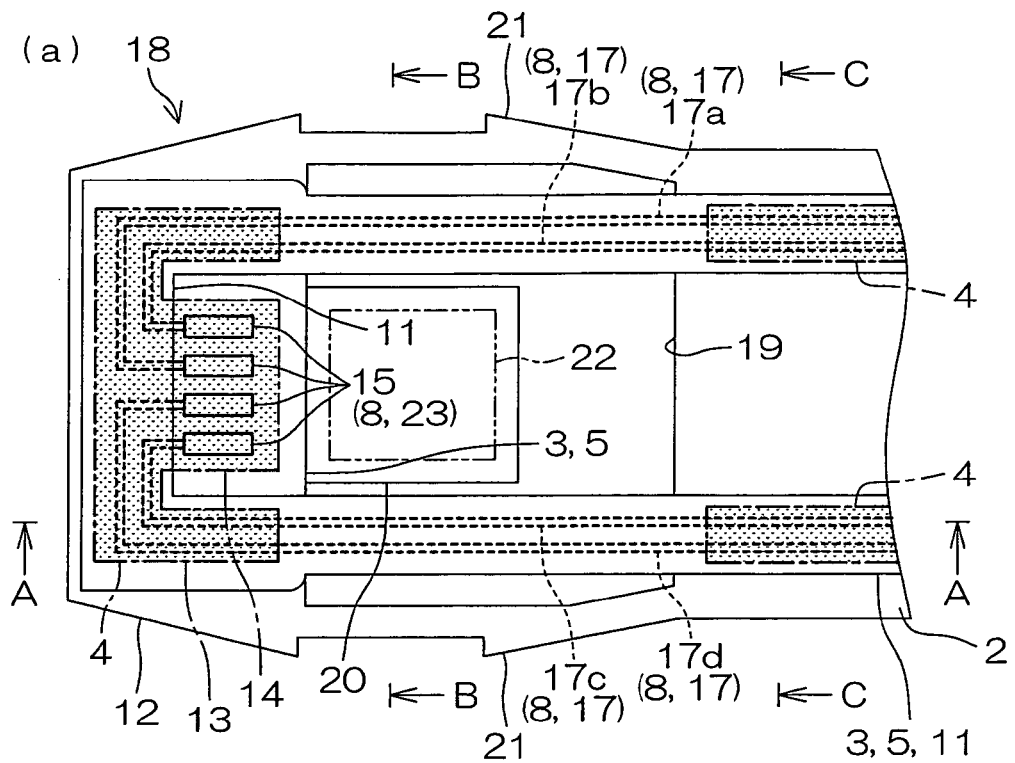
FIG. 2 is an enlarged view illustrating a tip portion of the suspension board with circuit shown in FIG. 1, (a) showing a plan view of a main portion thereof, and (b) showing a rear view of a main portion thereof.
Figure 2:
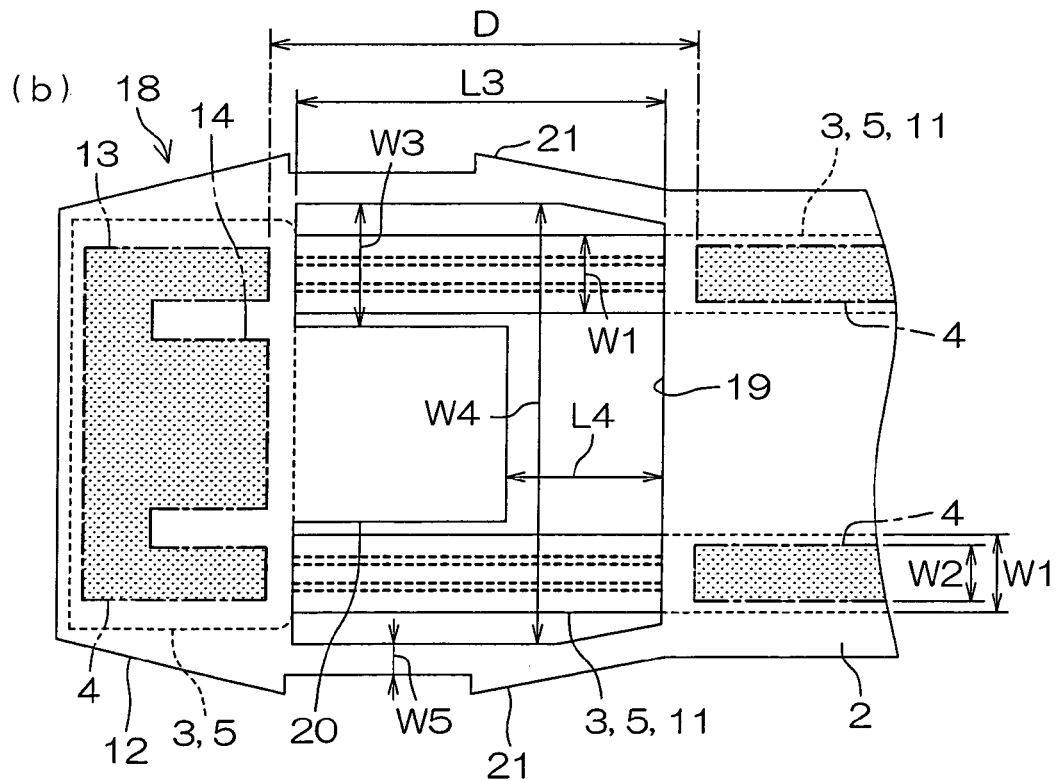
Figure 3:
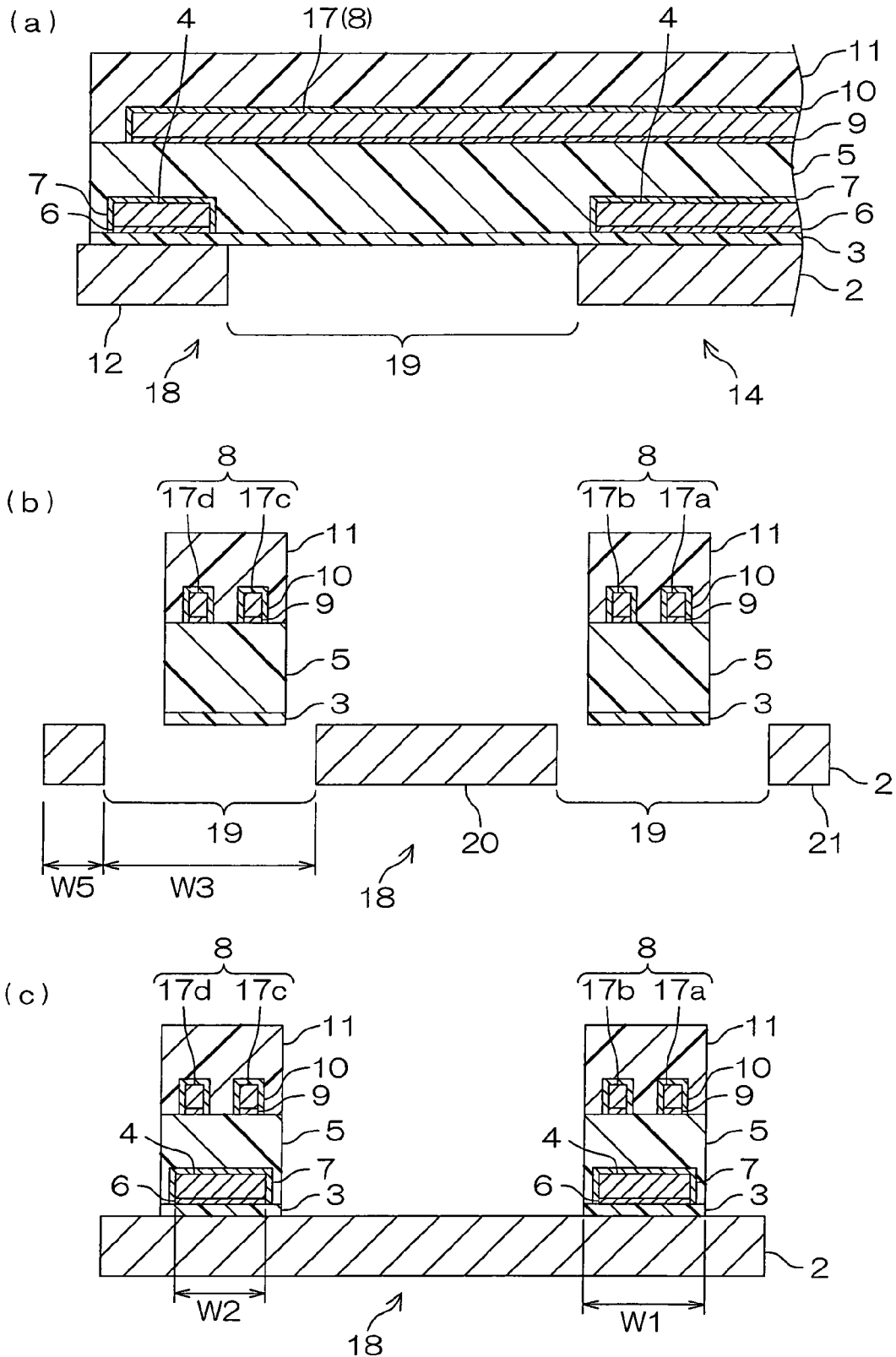
FIG. 3 is a sectional view of the tip portion shown in FIG. 2, (a) showing a sectional view taken along the line A-A, (b) showing a sectional view taken along the line B-B, and (c) showing a sectional view taken along the line C-C.

FIG. 1 is a plan view of a suspension board with circuit as an embodiment of a wired circuit board according to the present invention; FIG. 2 is an enlarged view illustrating a tip portion of the suspension board with circuit shown in FIG. 1, (a) showing a plan view of a main portion thereof, and (b) showing a rear view of a main portion thereof, and FIG. 3 is a sectional view of the tip portion shown in FIG. 2, (a) showing a sectional view taken along the line A-A, (b) showing a sectional view taken along the line B-B, and (c) showing a sectional view taken along the line C-C. To clarify a relative position of a conductive pattern 8 with respect to a metal supporting board 2, a second insulating base layer 3, a first insulating base layer 5, and an insulating cover layer 11, which are mentioned later, are omitted in FIG. 1.

In FIG. 1, the suspension board with circuit 1 includes the metal supporting board 2 mounted with a magnetic head (not shown) of a hard disk drive. The conductive pattern 8 for connecting the magnetic head and a read/write board (not shown) is formed integrally on the metal supporting board 2.

The conductive pattern 8 integrally includes a magnetic-head-side connecting terminal portion 15 for connecting with a connecting terminal of the magnetic head, an external connecting terminal portion 16 for connecting with a connecting terminal of the read/write board, and a plurality of wires 17 for connecting the magnetic-head-side connecting terminal portion 15 and the external connecting terminal portion 16 (hereinafter simply referred to collectively as "terminal portion 23" in some cases), all mentioned later.

The metal supporting board 2 is formed in a generally crank shape in plane view extending in the lengthwise direction. The magnetic-head-side connecting terminal portion 15 is provided at lengthwise one end portion (hereinafter referred to as a front end portion) of the metal supporting board 2, while the external connecting terminal portion 16 is provided at the lengthwise other end portion (hereinafter referred to as a rear end portion) of the metal supporting board 2.

As shown in FIG. 3(c), the suspension board with circuit 1 includes a metal supporting board 2, a second insulating base layer 3 as a second insulating layer formed on the metal supporting board 2, and a first metal thin film 6 formed on the second insulating base layer 3. The suspension board with circuit 1 also includes a metal foil 4 formed on the first metal thin film 6, a second metal thin film 7 formed on the second insulating base layer 3 so as to cover the metal foil 4, and a first insulating base layer 5 as a first insulating layer formed on the second insulating base layer 3 so as to cover the second metal thin film 7. Further, the suspension board with circuit 1 includes a third metal thin film 9 formed on the first insulating base layer 5, a conductive pattern 8 formed on the third metal thin film 9, and a fourth metal thin film 10 formed on the first insulating base layer 5 so as to cover the conductive pattern 8. In addition, the suspension board with circuit 1 includes an insulating cover layer 11 formed on the first insulating base layer 5 so as to cover the fourth metal thin film 10.

The metal supporting board 2 is formed of a metal foil or a metal thin plate. The length and width of the metal supporting board 2 are appropriately selected depending on the purpose and application.

The second insulating base layer 3 is formed continuously in the lengthwise direction on a surface of the metal supporting board 2 in a portion corresponding to the conductive pattern 8. As shown in FIG. 2, two second insulating base layers 3 are arranged in a lengthwise intermediate portion along the lengthwise direction at spaced intervals with each other on both widthwise sides. At a front end portion and a rear end portion (not shown in FIG. 2) of the suspension board with circuit 1, the second insulating base layers 3 are formed along the widthwise direction so that the respective second insulating base layers 3 on both widthwise sides are continuous.

The width of the second insulating base layer 3 is appropriately selected. The second insulating base layer 3 arranged in the lengthwise intermediate portion has a width W1 in the range of, for example, 0.03 to 5 mm, or preferably 0.1 to 3 mm.

As shown in FIG. 3(c), the first metal thin film 6 is formed on a surface of the second insulating base layer 3 as a pattern opposed in the thickness direction to a portion where the metal foil 4 is formed. The first metal thin film 6 is interposed between the metal foil 4 and the second insulating base layer 3.

The metal foil 4 is formed above the second insulating base layer 3 and on a surface of the first metal thin film 6 as a pattern opposed in the thickness direction to a portion where the conductive pattern 8 is formed. More specifically, the metal foil 4 is formed on the entire upper surface of the first metal thin film 6.

The metal foil 4 is formed so as to be narrower than the second insulating base layer 3. The metal foil 4 arranged in the lengthwise intermediate portion has a width W2 in the range of, for example, 0.02 to 4.99 mm, or preferably 0.09 to 2.99 mm.

The second metal thin film 7 is formed on a surface of the metal foil 4 so as to cover the metal foil 4. More specifically, the second metal thin film 7 is formed on the upper surface and the side surfaces of the metal foil 4, and the side surfaces of the first metal thin film 6 so as to cover all these surfaces. The second metal thin film 7 is interposed between the metal foil 4 and the first metal thin film 6, and the first insulating base layer 5.

The first insulating base layer 5 is formed on the second insulating base layer 3 so as to cover the second metal thin film 7. More specifically, the first insulating base layer 5 in the width direction is formed on the entire upper surface of the second insulating base layer 3 so as to cover the side surfaces and the upper surface of the second metal thin film 7. The width of the first insulating base layer 5 arranged in the lengthwise intermediate portion may be, for example, the same as or different from the width W1 of the second insulating base layer 3, and is in the range of, for example, 0.03 to 5 mm, or preferably 0.1 to 3 mm.

The third metal thin film 9 is formed on a surface of the first insulating base layer 5 as a pattern opposed in the thickness direction to a portion where the conductive pattern 8 is formed. The third metal thin film 9 is interposed between the first insulating base layer 5 and the conductive pattern 8.

The conductive pattern 8 is arranged on the first insulating base layer 5 and on a surface of the third metal thin film 9. As shown in FIG. 1, the conductive pattern 8 is formed in the lengthwise intermediate portion as a wired circuit pattern including a plurality (e.g., 4 pieces) of wires 17a, 17b, 17c, and 17d provided in parallel to one another along the lengthwise direction, and the terminal portion 23 connected to the respective wires 17.

In the conductive pattern 8, the wires 17a, 17b, 17c, and 17d are sequentially arranged in parallel from widthwise one side toward the widthwise other side. Further, as shown in FIG. 2(a), the wires 17a and 17b, and the wires 17c and 17d are each provided in pairs so as to correspond to the respective second insulating base layers 3.

As shown in FIG. 1, the terminal portion 23 is each arranged in array along the widthwise direction, and is formed as a broad land. Front ends of the wires 17 are connected to the magnetic-head-side connecting terminal portion 15, while rear ends of the wires 17 are connected to the external connecting terminal portion 16.

Each of the wires 17 has a width in the range of, for example, 10 to 150 μm, or preferably 20 to 100 μm. The spacing between the wires 17a and 17b, and the spacing between the wires 17c and 11d are in the range of, for example, 10 to 200 μm, or preferably 20 to 150 μm. In the lengthwise intermediate portion, the spacing between the wires 17b and 17c is in the range of, for example, 10 to 1000 μm, or preferably 15 to 500 μm. The length L1 of the respective wires 17 is appropriately selected, and is in the range of, for example, 5 to 200 mm, or preferably 10 to 100 mm.

As shown in FIG. 3(c), the fourth metal thin film 10 is formed on a surface of the conductive pattern 8 so as to cover the conductive pattern 8. More specifically, the fourth metal thin film 10 is formed on the upper surface and the side surfaces of the respective wires 17, and the side surfaces of the third metal thin film 9 so as to cover all these surfaces. The fourth metal thin film 10 is interposed between the conductive pattern 8 and the third metal thin film 9, and the insulating cover layer 11. Although not shown, the fourth metal thin film 10 is also formed so as to expose the terminal portion 23.

The insulating cover layer 11 is formed on the first insulating base layer 5 so as to cover the fourth metal thin film 10. More specifically, the insulating cover layer 11 is formed on the entire upper surface of the first insulating base layer 5 so as to cover the side surfaces and the upper surface of the fourth metal thin film 10. As referred to FIG. 2(a), the insulating cover layer 11 is formed so as to expose the terminal portion 23.

As shown in FIG. 2, a gimbal portion 18 is provided at the front end portion of the suspension board with circuit 1.

The gimbal portion 18 has a notched portion 19 as an opening extending through the suspension board with circuit 1 in the thickness direction. The notched portion 19 is formed generally at the widthwise center of the gimbal portion 18 and at a lengthwise intermediate portion thereof, and is formed in a generally U-shape opening toward the front side in plane view.

The gimbal portion 18 has a tongue portion 20 sandwiched by the notched portion 19 in the widthwise direction, an outrigger portion 21 arranged on each of the widthwise outer sides of the notched portion 19, and a terminal forming portion 12 arranged on the front side of the tongue portion 20 and the outrigger portion 21.

The size of the gimbal portion 18 is appropriately selected. As referred to FIG. 2(b), the notched portion 19 on each of the widthwise outer sides of the tongue portion 20 has a width W3 in the range of, for example, 0.05 to 2 mm, or preferably 0.1 to 1 mm, and a length L3 in the range of, for example, 0.1 to 10 mm, or preferably 1 to 7 mm. The notched portion 19 on the rear side of the tongue portion 20 has a width (length in widthwise direction) W4 in the range of, for example, 0.1 to 10 mm, or preferably 0.5 to 7 mm, and a length (length in lengthwise direction) L4 is in the range of, for example, 0.05 to 9 mm, or preferably 0.5 to 6 mm. The outrigger portion 21 has a width W5 in the range of, for example, 0.03 to 3 mm, or preferably 1 to 2.5 mm. The terminal forming portion 12 has a length in the range of, for example 0.1 to 10 mm, or preferably 1 to 7 mm.

The tongue portion 20 is formed in a generally rectangular shape in plane view extending from the terminal forming portion 12 toward the rear side. As shown in phantom line in FIG. 2(a), the tongue portion 20 includes a mount portion 22 on which a slider (not shown) equipped with a magnetic head is mounted. The mounting portion 22, which is an area for mounting a slider, is arranged at the center of the tongue portion 20 both in the lengthwise direction and in the widthwise direction, and is formed in a generally rectangular shape in plane view. As shown in FIG. 3(b), the tongue portion 20 is formed only of the metal supporting board 2.

As shown in FIG. 2, the outrigger portion 21 is formed in a generally rectangular flat band in plane view extending along the lengthwise direction, and is provided between a rear end portion and a front end portion of the gimbal portion 18. Further, the outrigger portion 21 is formed to bend so as to protrude toward the widthwise outer sides of the gimbal portion 18 with respect to the rear end portion and the front end portion thereof. As shown in FIG. 3(b), the outrigger portion 21 is formed only of the metal supporting board 2.

As shown in FIG. 2, the terminal forming portion 12 is formed on the front side of the tongue portion 20 and the front side of the outrigger portion 21 so as to be continuous with these portions. The terminal forming portion 12 is arranged over the widthwise direction of the gimbal portion 18, and is formed in a generally rectangular shape in plane view. As shown in FIG. 3(a), the terminal forming portion 12 is formed with the metal supporting board 2, the second insulating base layer 3, the first metal thin film 6, the metal foil 4, the second metal thin film 7, the first insulating base layer 5, the third metal thin film 9, the conductive pattern 8, the fourth metal thin film 10, and the insulating cover layer 11.

As shown in FIGS. 2(a) and 3(a), the second insulating base layers 3 at rear end portion of the gimbal portion 18 are formed so as to be continuous from the front ends of the respective second insulating base layers 3 arranged in the lengthwise intermediate portion. As shown in FIG. 2, the second insulating base layers 3 are formed so as to pass over the notched portion 19 on both widthwise outer sides of the tongue portion 20, and to linearly extend from the second insulating base layers 3 in the lengthwise intermediate portion toward the terminal forming portion 12.

The respective second insulating base layers 3 then reach the terminal forming portion 12, in which the second insulating base layers 3 are formed in a generally rectangular shape in plane view along the widthwise direction of the terminal forming portion 12.

As shown in dash-dotted line in FIG. 2, the metal foils 4 at the rear end portion of the gimbal portion 18 are formed so as to be continuous from the front ends of the respective metal foils 4 arranged in the lengthwise intermediate portion, and are formed so as to extend from the metal foils 4 in the lengthwise intermediate portion to a portion slightly behind of the rear end edge of the notched portion 19. The metal foil 4 is not formed in the notched portion 19, but formed in the terminal forming portion 12. That is, the metal foil 4 is divided by the notched portion 19 along the lengthwise direction. In the terminal forming portion 12, the metal foil 4 is formed so as to be opposed to the magnetic-head-side connecting terminal portion 15 and the respective wires 17 in the thickness direction, and is formed along the width direction of the terminal forming portion 12.

More specifically, the metal foil 4 in the terminal forming portion 12 integrally includes a U-shaped portion 13 opposed to the respective wires 17 in the thickness direction, and an extending portion 14 continuously extending from the widthwise center of the U-shaped portion 13 toward the rear side and opposed to the magnetic-head-side connecting terminal portion 15 in the thickness direction. The U-shaped portion 13 is formed in a generally U-shape opening rearward in plane view, while the extending portion 14 is formed in a generally rectangular shape in plane view.

The length (cf. FIG. 2(b)) D by which the metal foil 4 is divided is in the range of, for example, 1.0 to 20 mm, or preferably 1.1 to 10.1 mm.

Thus, the entire length, that is, the total of the length along the respective wires 17, of the metal foil 4 is set to, for example, 70% or more, or preferably 80% or more, and usually 95% or less, per 100% of the length of the respective wires 17. In other words, the area of the metal foil 4 opposed to the respective wires 17 in the thickness direction is set to, for example, 70% or more, or preferably 80% or more, and usually 95% or less, per 100% of the area of the respective wires 17. It should be noted that when the area of the metal foil 4 is less than the above-mentioned range, it may be difficult to reduce the transmission loss in the conductive pattern 8 in some cases.

As shown in FIG. 3(a), at the rear end portion of the gimbal portion 18, the first metal thin film 6 and the second metal thin film 7 are formed so as to be continuous from the first metal thin film 6 and the second metal thin film 7, respectively, that are arranged in the lengthwise intermediate portion of the suspension board with circuit 1. In the gimbal portion 18 except the notched portion 19, the first metal thin film 6 is formed on the upper surface of the second insulating base layer 3 in a pattern of the metal foil 4. In the gimbal portion 18, the second metal thin film 7 is formed on a surface of the metal foil 4.

The first insulating base layers 5 at the rear end portion of the gimbal portion 18 are formed so as to be continuous from the front ends of the respective first insulating base layers 5 arranged in the lengthwise intermediate portion of the suspension board with circuit 1. As shown in FIG. 2, the first insulating base layers 5 are formed so as to pass over the notched portion 19 on both widthwise outer sides of the tongue portion 20, and to linearly extend from the front ends of the first insulating base layers 5 in the lengthwise intermediate portion toward the front side of the gimbal portion 18. The respective first insulating base layers 5 then reach the terminal forming portion 12, in which the first insulating base layers 5 are formed in a generally rectangular shape in plane view along the widthwise direction of the gimbal portion 18.

That is, as shown in FIG. 3(a), the first insulating base layer 5 in the rear end portion of the gimbal portion 18 and the terminal forming portion 12 is formed on the entire upper surface of the second insulating base layer 3 so as to cover the side surfaces and the upper surface of the second metal thin film 7. The first insulating base layer 5 in the notched portion 19 is formed on the entire upper surface of the second insulating base layer 3.

As shown in dashed line in FIG. 2, the conductive pattern 8 at the rear end portion of the gimbal portion 18 is formed so that the respective wires 17 are continuous from the front ends of the respective wires 17 in the lengthwise intermediate portion of the suspension board with circuit 1 and so that the magnetic-head-side connecting terminal portion 15 is formed in the terminal forming portion 12.

The respective wires 17 at the rear end portion of the gimbal portion 18 linearly extend toward the terminal forming portion 12 so as to pass over the notched portion 19 on both widthwise outer sides of the tongue portion 20 along the lengthwise direction. The respective wires 17 then reach the terminal forming portion 12, in which the wires 17 are once bent toward the widthwise inner side, further bent toward the rear side, and thereafter routed so as to be continuous with the front end portion of the magnetic-head-side connecting terminal portion 15.

As shown in FIG. 3(a), in the gimbal portion 18, the third metal thin film 9 and the fourth metal thin film 10 are formed so as to be continuous from the third metal thin film 9 and the fourth metal thin film 10, respectively, that are arranged in the lengthwise intermediate portion of the suspension board with circuit 1 in the lengthwise direction. The third metal thin film 9 in the gimbal portion 18 is formed on the upper surface of the first insulating base layer 5 in the wired circuit pattern of the conductive pattern 8, while the fourth metal thin film 10 is formed on surfaces of the wires 17.

As shown in FIG. 2, the insulating cover layers 11 at the rear end portion of the gimbal portion 18 are formed so as to be continuous from the front ends of the respective insulating cover layers 11 arranged in the lengthwise intermediate portion of the suspension board with circuit 1. The insulating cover layers 11 are formed so as to pass over the notched portion 19 on both widthwise outer sides of the tongue portion 20, and to linearly extend from the front ends of the first insulating base layers 5 in the lengthwise intermediate portion toward the front side of the gimbal portion 18.

The respective insulating cover layers 11 then reach the terminal forming portion 12, in which the insulating cover layers 11 are formed in a generally U-shape in plane view opening rearward. This allows the insulating cover layer 11 to expose the magnetic-head-side connecting terminal portion 15.

Figure 4:
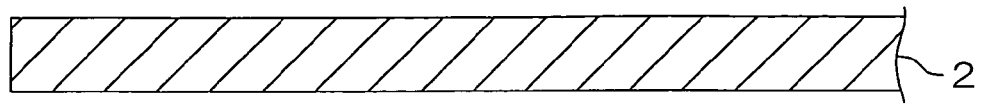
FIG. 4 is a production process diagram illustrating the steps of producing the suspension board with circuit shown in FIG. 3, and is a sectional view corresponding to FIG. 3(a), (a) showing the step of preparing a metal supporting board, (b) showing the step of forming a second insulating base layer on the metal supporting board, (c) showing the step of forming a first metal thin film on the second insulating base layer, and (d) showing the step of forming a metal foil on the first metal thin film and removing the first metal thin film exposed from the metal foil.
Figure 4:
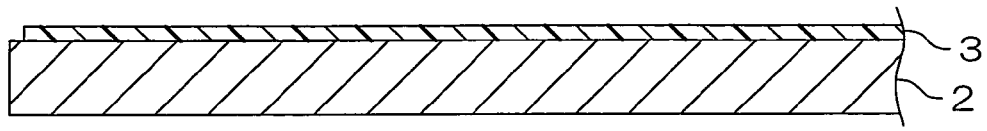
Figure 4:
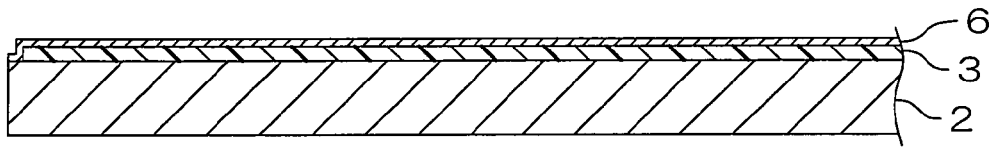
Figure 4:
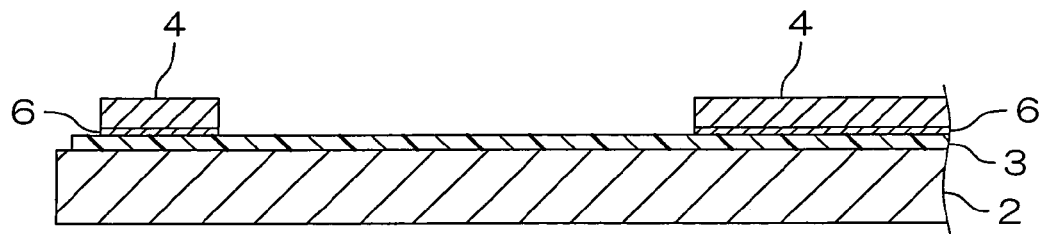
Figure 5:
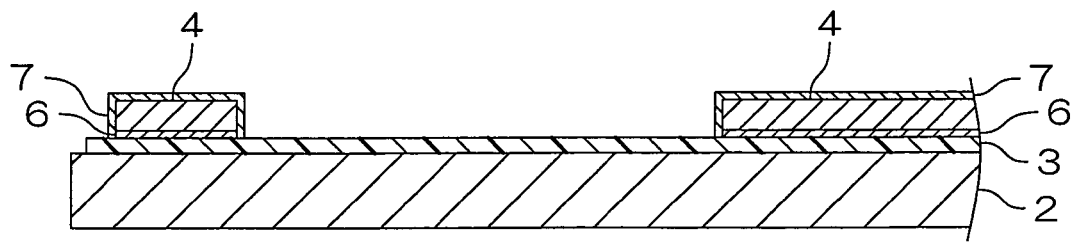
FIG. 5 is a production process diagram subsequent to FIG. 4, illustrating the steps of producing the suspension board with circuit shown in FIG. 3, and is a sectional view corresponding to FIG. 3(a), (e) showing the step of forming a second metal thin film on a surface of the metal foil, (f) showing the step of forming a first insulating base layer on the second insulating base layer, and (g) showing the step of sequentially forming a third metal thin film and a conductive pattern on the first insulating base layer.
Figure 5:
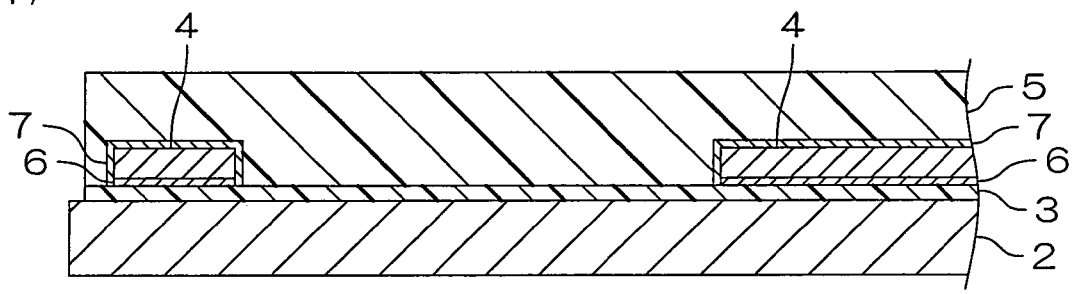
Figure 5:
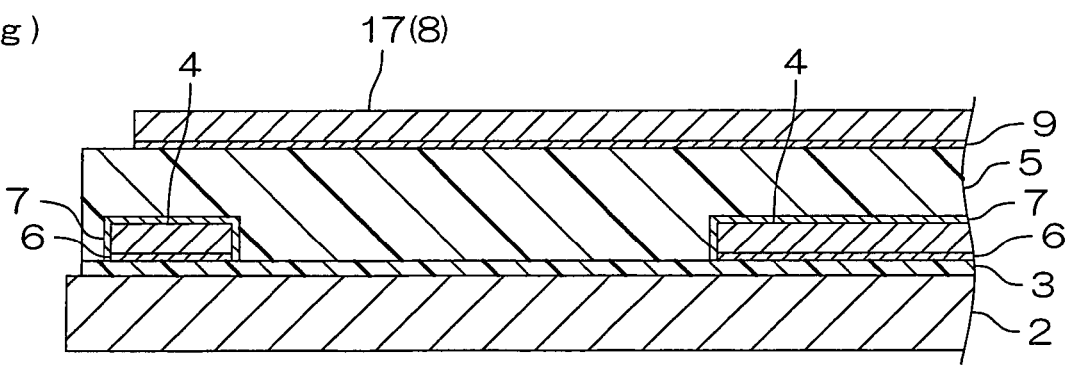
Figure 6:
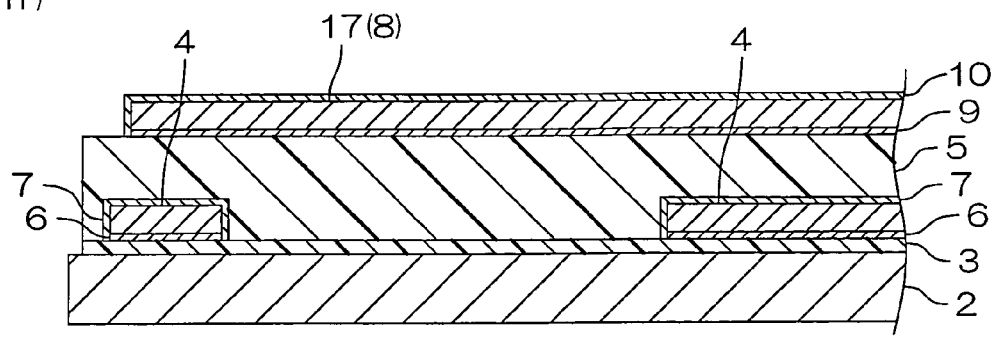
FIG. 6 is a production process diagram subsequent to FIG. 5, illustrating the steps of producing the suspension board with circuit shown in FIG. 3, and is a sectional view corresponding to FIG. 3(a), (h) showing the step of forming a fourth metal thin film on a surface of the conductive pattern, (i) showing the step of forming an insulating cover layer on the first insulating base layer, and (j) showing the step of forming a notched portion by trimming the metal supporting board.
Figure 6:
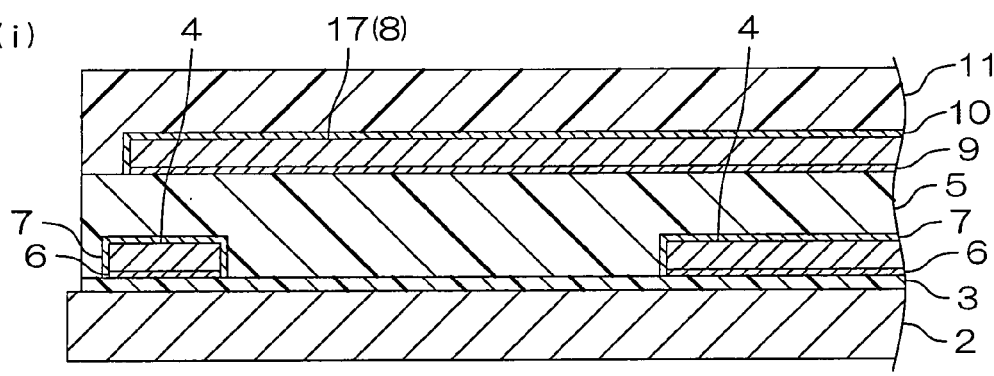
Figure 6:
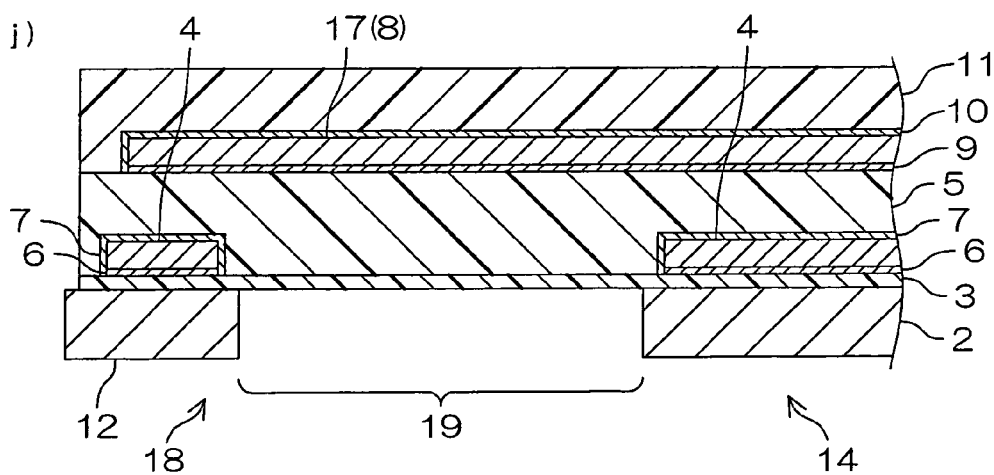

FIGS. 4 to 6 are production process diagrams illustrating the steps of producing the suspension board with circuit shown in FIG. 3, and are sectional views corresponding to FIG. 3(a).

Next, a method for producing this suspension board with circuit 1 will be described with reference to FIGS. 4 to 6.

First, in this method, the metal supporting board 2 is prepared, as shown in FIG. 4(a).

The metal that may be used to form the metal supporting board 2 includes, for example, stainless steel, 42-alloy, or preferably, stainless steel. The metal supporting board 2 has a thickness in the range of, for example, 15 to 30 μm, or preferably 20 to 25 μm.

Then, in this method, as shown in FIG. 4(b), the second insulating base layer 3 is formed on the metal supporting board 2.

The insulator that may be used to form the second insulating base layer 3 includes, for example, synthetic resin such as polyimide, polyether nitrile, polyether sulfone, polyethylene terephthalate, polyethylene naphthalate, or polyvinyl chloride. Of these, preferably a photosensitive synthetic resin, or more preferably, a photosensitive polyimide is used.

To form the second insulating base layer 3, for example, a photosensitive synthetic resin is coated on the metal supporting board 2 and then dried. Thereafter, the coated resin is exposed to light in the above-mentioned pattern, and then developed to be cured as required.

Alternatively, the second insulating base layer 3 can be formed in the following manner. A solution of the above-mentioned synthetic resin is uniformly applied onto the metal supporting board 2 and then dried. Subsequently, the solution thus applied is heated to be cured as required. Thereafter, the above-mentioned pattern is formed by etching or the like. Further, the method for forming the second insulating base layer 3 is not limited to those described above; for example, a synthetic resin is preliminarily formed on a film in the above-mentioned pattern, and the patterned film is adhesively bonded to a surface of the metal supporting board 2 via a known adhesive layer.

The second insulating base layer 3 thus formed has a thickness in the range of, for example 0.5 to 5 μm, or preferably 1 to 3 μm.

Then, in this method, as shown in FIG. 4(c), the first metal thin film 6 is formed on the second insulating base layer 3 including the metal supporting board 2.

The metal that may be used to form the first metal thin film 6 includes, for example, copper, chromium, gold, silver, platinum, nickel, titanium, silicon, manganese, zirconium, and alloys thereof, or oxides thereof. Of these metals, preferably copper, chromium, nickel, and alloys thereof are used. The first metal thin film 6 can be also formed of a plurality of layers.

The first metal thin film 6 is formed, for example, by sputtering, electrolytic plating, or electroless plating.

The sputtering that may be used includes, for example, sputtering using the above-mentioned metal as a target. Preferably, chromium sputtering and copper sputtering are used, and a thin chromium film and a thin copper film are sequentially laminated by these sputtering.

The electrolytic plating that may be used includes, for example, electrolytic plating by energizing the suspension board with circuit 1 in a production process shown in FIG. 4(b) while dipping it in a plating solution containing the above-mentioned metal.

The electroless plating that may be used includes, for example, electroless plating by dipping the suspension board with circuit 1 in a production process shown in FIG. 4(b) in a plating solution containing the above-mentioned metal.

Of these, the first metal thin film 6 is formed, preferably by sputtering.

The first metal thin film 6 thus formed has a thickness in the range of, for example, 0.01 to 1 μm, or preferably 0.01 to 0.1 μm.

Then, in this method, as shown in FIG. 4(d), the metal foil 4 is formed on the first metal thin film 6 in the above-mentioned pattern, and the first metal thin film 6 exposed from the metal foil 4 is removed.

To form the metal foil 4, a surface of the first metal thin film 6 is patterned, for example, by an additive method, a subtractive method, or the like.

In the additive method, a plating resist is first formed in a pattern reverse to the above-mentioned pattern on a surface of the first metal thin film 6. The metal foil 4 is then formed on a surface of the first metal thin film 6 exposed from the plating resist by electrolytic plating. Thereafter, the plating resist and the first metal thin film 6 on which the plating resist is laminated are removed.

In the subtractive method, a conductive layer is first formed on a surface of the first metal thin film 6. To form the conductive layer, for example, a conductive layer is adhesively bonded to a surface of the first metal thin film 6 via a known adhesive layer. Then, an etching resist having the same pattern as the above-mentioned pattern is formed on the conductive layer, and the conductive layer is etched using the etching resist as a resist to form the metal foil 4. Subsequently, the first metal thin film 6 exposed from the etching resist is etched, and thereafter, the etching resist is removed.

Thus, the metal foil 4 can be formed in the above-mentioned pattern in which the metal foil 4 is divided along the lengthwise direction in the notched portion 19, and the first metal thin film 6 exposed from the metal foil 4 can be removed.

The metal foil 4 thus formed has a thickness in the range of, for example, 0.1 to 5 μm, or preferably 1 to 5 μm.

Then, in this method, as shown in FIG. 5(e), the second metal thin film 7 is formed on a surface of the metal foil 4 (including side surfaces of the first metal thin film 6).

The metal that may be used to form the second metal thin film 7 includes, for example, nickel, chromium, or an alloy of nickel and chromium (Nichrome). Of these metals, nickel is preferably used.

The second metal thin film 7 is formed, for example, by sputtering, electrolytic plating, or electroless plating. Preferably, the second metal thin film 7 is formed by electroless plating.

In electroless plating, the second metal thin film 7 made of nickel is formed, for example, by dipping the suspension board with circuit 1 in a production process shown in FIG. 4(d) in a plating solution containing the above-mentioned metal, or preferably a nickel plating solution.

The second metal thin film 7 thus formed has a thickness in the range of, for example, 0.01 to 1 μm, or preferably 0.01 to 0.1 μm.

Then, in this method, as shown in FIG. 5(f), the first insulating base layer 5 is formed on the second insulating base layer 3 so as to cover the second metal thin film 7.

As an insulator for forming the first insulating base layer 5, the same insulator as that used for the above-mentioned second insulating base layer 3 is used. Preferably, a photosensitive synthetic resin is used, or more preferably, a photosensitive polyimide is used.

To form the first insulating base layer 5, for example, a photosensitive synthetic resin is coated on the second insulating base layer 3 including the second metal thin film 7 and then dried. Thereafter, the coated resin is exposed to light in the above-mentioned pattern, and then developed to be cured as required.

Alternatively, the first insulating base layer 5 can be formed in the following manner. A solution of the above-mentioned synthetic resin is uniformly applied onto the second insulating base layer 3 including the second metal thin film 7 and then dried. Subsequently, the solution thus applied is heated to be cured as required. Thereafter, the above-mentioned pattern is formed by etching or the like. Further, the method for forming the first insulating base layer 5 is not limited to those described above; for example, a synthetic resin is preliminarily formed on a film in the above-mentioned pattern, and the patterned film is adhesively bonded to a surface of the second insulating base layer 3 including the second metal thin film 7 via a known adhesive layer.

The first insulating base layer 5 thus formed has a thickness in the range of, for example, 1 to 10 μm, or preferably 5 to 10 μm.

Then, in this method, as shown in FIG. 5(*g*), the third metal thin film 9 and the conductive pattern 8 are sequentially formed on the first insulating base layer 5 in the above-mentioned wired circuit pattern.

To form the third metal thin film 9 and the conductive pattern 8, the third metal thin film 9 is first formed on the first insulating base layer 5. The conductive pattern 8 is then formed in the above-mentioned pattern, and the third metal thin film 9 exposed from the conductive pattern 8 is removed.

As a metal for forming the third metal thin film 9, the same metal as that used for the above-mentioned first metal thin film 6 is used. Preferably, copper, chromium, and nickel are used. The third metal thin film 9 can also be formed of a plurality of layers.

The third metal thin film 9 is formed in the same manner as the method for forming the first metal thin film 6. The third metal thin film 9 is formed by sequentially laminating a thin chromium film and a thin copper film, preferably, by chromium sputtering and copper sputtering. The third metal thin film 9 thus formed has a thickness in the range of, for example, 0.01 to 1 μm, or preferably 0.01 to 0.1 μm.

To form the conductive layer 8, a surface of the third metal thin film 9 is patterned, for example, by an additive method, a subtractive method, or the like.

In the additive method, a plating resist is first formed in a pattern reverse to the above-mentioned wired circuit pattern on a surface of the third metal thin film 9. The conductive pattern 8 is then formed on a surface of the third metal thin film 9 exposed from the plating resist by electrolytic plating. Thereafter, the plating resist and the third metal thin film 9 on which the plating resist is laminated are removed.

In the subtractive method, a conductive layer is first formed on a surface of the third metal thin film 9. To form the conductive layer, for example, a conductive layer is adhesively bonded to a surface of the third metal thin film 9 via a known adhesive layer. Then, an etching resist having the same pattern as the above-mentioned wired circuit pattern is formed on the conductive layer, and the conductive layer is etched using the etching resist as a resist to form the conductive pattern 8. Subsequently, the third metal thin film 9 exposed from the etching resist is etched, and thereafter, the etching resist is removed.

The conductive pattern 8 thus formed has a thickness in the range of, for example, 5 to 20 μm, or preferably 7 to 15 μm.

Then, in this method, as shown in FIG. 6(*h*), the fourth metal thin film 10 is formed on a surface of the conductive pattern 8 (including side surfaces of the third metal thin film 9).

As a metal for forming the fourth metal thin film 10, the same metal as that used for the second metal thin film 7 is used. Preferably, nickel is used.

The fourth metal thin film 10 is formed in the same manner as the method for forming the second metal thin film 7. The fourth metal thin film 10 made of nickel is formed by electroless nickel plating in which the suspension board with circuit 1 in a production process shown in FIG. 5(*g*) is dipped preferably in a nickel plating solution.

The fourth metal thin film 10 thus formed has a thickness in the range of, for example, 0.01 to 1 μm, or preferably 0.01 to 0.1 μm.

Then, in this method, as shown in FIG. 6(*i*), the insulating cover layer 11 is formed on the first insulating base layer 5 so as to cover the fourth metal thin film 10.

As an insulator for forming the insulating cover layer 11, the same insulator as that used for the above-mentioned second insulating base layer 3 is used. Preferably, a photosensitive synthetic resin is used, or more preferably, a photosensitive polyimide is used.

To form the insulating cover layer 11, for example, a photosensitive synthetic resin is coated on the first insulating base layer 5 including the fourth metal thin film 10 and then dried. Thereafter, the coated resin is exposed to light in the above-mentioned pattern, and then developed to be cured as required.

Alternatively, the insulating cover layer 11 can be formed in the following manner. A solution of the above-mentioned synthetic resin is uniformly applied onto the first insulating base layer 5 including the fourth metal thin film 10 and then dried. Subsequently, the solution thus applied is heated to be cured as required. Thereafter, the above-mentioned pattern is formed by etching or the like. Further, the method for forming the insulating cover layer 11 is not limited to those described above; for example, a synthetic resin is preliminarily formed on a film in the above-mentioned pattern, and the patterned film is adhesively bonded to a surface of the first insulating base layer 5 including the fourth metal thin film 10 via a known adhesive layer.

The insulating cover layer 11 thus formed has a thickness in the range of, for example, 2 to 10 μm, or preferably 3 to 6 μm.

Thereafter, although not shown, the fourth metal thin film 10 formed on the upper surface of the terminal portion 23 is removed by etching or the like.

Then, in this method, as shown in FIG. 6(*j*), the metal supporting board 2 is trimmed, for example, by etching, perforating, laser processing, or the like, and the notched portion 19 is formed to obtain the suspension board with circuit 1 having the gimbal portion 18.

In the suspension board with circuit 1, the metal foil 4 is opposed to the wires 17 in a portion except the notched portion 19 in the thickness direction. Therefore, such simple layer structure allows reduction in the transmission loss in the conductive pattern 8.

On the other hand, in the notched portion 19, the metal foil 4 is not opposed to the wires 17 in the thickness direction, so that the second insulating base layer 3, the first insulating base layer 5, the respective wires 17, and the insulating cover layer 11 all in the notched portion 19 have a smaller rigidity, thereby allowing to secure flexibility. Thus, when a slider equipped with a magnetic head is mounted in the mounting portion 22, a floating posture (angle) of the slider with respect to a magnetic disk can be precisely adjusted. Even in the case where a small slider is mounted therein, the floating posture (angle) of the slider can be precisely adjusted.

As a result of this, the transmission loss in the conductive pattern 8 can be reduced, and, at the same time, the floating posture of the slider can be precisely adjusted.

The second insulating base layer 3 in the portion except the notched portion 19 is interposed between the first metal thin film 6 and the metal supporting board 2. Therefore, such simple layer structure allows reduction in the transmission loss in the conductive pattern 8. At the same time, adhesion between the first metal thin film 6 and the metal supporting board 2 is effectively achieved, thereby ensuring excellent long-term reliability.

The first metal thin film 6 in the portion except the notched portion 19 is interposed between the metal foil 4 and the second insulating base layer 3. Therefore, such simple layer structure allows reduction in transmission loss. At the same time, adhesion between the metal foil 4 and the second insulating base layer 3 is effectively achieved, thereby ensuring excellent long-term reliability.

In short, in the portion except the notched portion 19 of the suspension board with circuit 1, the second insulating base layer 3 and the first metal thin film 6 are sequentially formed between the metal supporting board 2 and the metal foil 4. Therefore, such simple layer structure allows reduction in transmission loss. At the same time, adhesion between the metal supporting board 2 and the metal foil 4 is effectively achieved, respectively, thereby ensuring excellent long-term reliability.

In the above explanation, the wired circuit board of the present invention has been illustrated and described with the suspension board with circuit 1 including the metal supporting board 2. However, the wired circuit board of the present invention is not limited thereto, and can be widely applied to other wired circuit boards, such as a flexible wired circuit board having the metal supporting board 2 provided as a reinforcing layer.

In the above explanation, the notched portion 19 is formed in the gimbal portion 18. However, the gimbal portion 18 can also be formed in the shape of a flat plate continuous in the lengthwise direction and the widthwise direction without forming the notched portion 19.

Preferably, the notched portion 19 is formed in the gimbal portion 18, and the layers described above are arranged so as to pass over the notched portion 19. Such arrangement thus allows each of the layers in the notched portion 19 to have even smaller rigidity.

In the above explanation, the wired circuit board of the present invention has been illustrated and described with the suspension board with circuit 1 including the second insulating base layer 3 and the first metal thin film 6. However, the wired circuit board of the present invention is not limited thereto, and can also be applied to a wired circuit board not including the second insulating base layer 3 and/or the first metal thin film 6.

EXAMPLE

While in the following, the present invention is described in further detail with reference to Examples and Comparative Example, the present invention is not limited to any of them.

Example 1

First, a metal supporting board made of a 25 µm-thick stainless steel was prepared (cf. FIG. 4(a)). A varnish of a photosensitive polyamic acid resin was coated on a surface of the metal supporting board and then dried. Thereafter, the dried varnish was exposed to light and developed and further heated to be cured, so that a 10 µm-thick second insulating base layer made of polyimide was formed in the above-mentioned pattern (cf. FIG. 4(b)).

Subsequently, a 0.03 µm-thick thin chromium film and a 0.07 µm-thick thin copper film were sequentially formed as a first metal thin film on a surface of the second insulating base layer including the metal supporting board by chromium sputtering and copper sputtering (cf. FIG. 4(c)).

Then, after a plating resist was formed in a pattern reverse to a metal foil pattern on a surface of the first metal thin film, and thereafter, a 4.0 µm-thick copper foil was formed as a metal foil on a surface of the first metal thin film exposed from the plating resist by electrolytic copper plating. The plating resist and the first metal thin film in a portion where the plating resist was formed were then removed by chemical etching (cf. FIG. 4(d)). The metal foil was divided in the lengthwise direction and its divided length was 20 mm.

Next, a 0.1 µm-thick nickel thin film was formed as a second metal thin film on a surface of the metal foil (including side surfaces of the first metal thin film) by electroless nickel plating (cf. FIG. 5(e)).

A varnish of a photosensitive polyamic acid resin was then coated over the entire surface of the second insulating base layer including the second metal thin film and then dried. Thereafter, the dried varnish was exposed to light and developed and further heated to be cured, so that a 10 µm-thick first insulating base layer made of polyimide was formed in the above-mentioned pattern (cf. FIG. 5(f)).

Subsequently, a third metal thin film to be used as a seed film, and a conductive pattern were sequentially formed on the first insulating base layer by the additive method.

In the additive method, a 0.03 µm-thick thin chromium film and a 0.07 µm-thick thin copper film were sequentially formed as a third metal thin film on the entire surface of the first insulating base layer by chromium sputtering and copper sputtering. Then, a plating resist was formed in a pattern reverse to the conductive pattern on a surface of the third metal thin film. Thereafter, a 10 µm-thick conductive pattern integrally including a plurality of wires and a terminal portion was formed on a surface of the third metal thin film exposed from the plating resist by electrolytic copper plating. The plating resist and the third metal thin film in a portion where the plating resist was formed were then removed by chemical etching (cf. FIG. 5(g)).

Each of the wires had a length of 100 mm. The area of the metal foil opposed to the respective wires in the thickness direction was 80% per 100% of the area of the respective wires.

Next, a 0.1 µm-thick nickel thin film was formed as a fourth metal thin film on a surface of the conductive pattern (including side surfaces of the third metal thin film) by electroless nickel plating (cf. FIG. 6(h)).

A varnish of a photosensitive polyamic acid resin was then coated on the entire surface of the first insulating base layer including the fourth metal thin film and then dried. Thereafter, the dried varnish was exposed to light and developed, and further heated to be cured, so that a 5 µm-thick insulating cover layer made of polyimide was formed in the above-mentioned pattern (cf. FIG. 6(i)). Thereafter, the fourth metal thin film formed on the upper surface of the terminal portion was removed by etching.

The metal supporting board was subsequently etched to obtain a suspension board with circuit including a gimbal portion formed with a notched portion (cf. FIG. 6(j)). The metal foil was formed so as to be divided in the notched portion.

Example 2

A suspension board with circuit was obtained in the same manner as in Example 1 except that the divided length of the metal foil was changed to 30 mm. The area of the metal foil opposed to the respective wires in the thickness direction was 70% per 100% of the area of the respective wires.

Example 3

A suspension board with circuit was obtained in the same manner as in Example 1 except that the divided length of the metal foil was changed to 40 mm. The area of the metal foil opposed to the respective wires in the thickness direction was 60% per 100% of the area of the respective wires.

Comparative Example 1

A suspension board with circuit was obtained in the same manner as in Example 1 except that, in the gimbal portion, the metal foil, and the first metal thin film and the second metal thin film were formed continuously along the lengthwise direction.

(Evaluation)
(1) Transmission Efficiency

With the suspension boards with circuit obtained in the Examples and the Comparative Example, an output signal strength ($P_{OUT}$) and an input signal strength ($P_{IN}$) were measured, and the transmission efficiency was evaluated as a ratio of the output signal strength to the input signal strength according to the following formula (1). Table 1 shows the result.

$$\text{Transmission efficiency (\%)} = P_{OUT}/P_{IN} \quad (1)$$

(2) Angle Control

A slider was mounted on the suspension boards with circuit obtained in the Examples and the Comparative Example, and a magnetic head was then mounted on the slider. Each of the suspension boards with circuit was installed on a hard disk drive, and then control of the angle of the magnetic head relative to a magnetic disk therein was evaluated by a three-dimensional measuring device. Table 1 shows the result.

TABLE 1

| Example/Comparative Example | Ex. 1 | Ex. 2 | Ex. 3 | Comp. Ex. 1 |
|---|---|---|---|---|
| Structure of Suspension Board with Circuit | | | | |
| Metal Foil Divided | Yes | Yes | Yes | No |
| Wire Length (mm) | 100 | 100 | 100 | 100 |
| Divided Length of Metal Foil (mm) | 20 | 30 | 40 | 0 |
| Area of Metal Foil Opposed to Wire (%) (vs Area of Wire) | 80 | 70 | 60 | 100 |
| Evaluation | | | | |
| Transmission Efficiency (%) | 77 | 74 | 65 | 78 |
| Angle Control | Good | Good | Good | Poor |

The legends, used in Table 1, indicating evaluation results of the angle control are described below.

Good: The angle of the magnetic head was able to be controlled as designed.

Poor: The angle of the magnetic head failed to be controlled as designed.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit comprising:
   a metal supporting board;
   a metal foil formed on the metal supporting board;
   a first insulating base layer formed on the metal supporting board so as to cover the metal foil;
   a conductive pattern formed on the first insulating base layer and having a plurality of wires; and
   an insulating cover layer formed on the first insulating base layer so as to cover the wires,
   wherein the metal supporting board is formed with an opening which is generally U-shaped in a plane view,
   wherein the suspension board with circuit further comprises a tongue portion sandwiched by the opening and for mounting a magnetic head, and an outrigger portion arranged on the outer side of the opening,
   wherein the opening is opposed to a part of the wires in a thickness direction covered by the first insulating base layer and the insulating cover layer in the thickness direction, and
   wherein the metal foil is arranged along a lengthwise direction of each of the wires so as not to be opposed to the part of the wires in the thickness direction and so as to be opposed to a remainder of the wires in the thickness direction;
   wherein the part of the wires opposed to the opening without the metal foil opposed thereto is covered at the entire lower surface thereof by the first insulating base layer and at the entire upper and side surfaces thereof by the insulating cover layer, respectively,
   further comprising a first metal thin film interposed between the metal foil and the metal supporting board.

2. The suspension board with circuit according to claim 1, wherein the metal foil opposed to each of the wires has an area of 70% or more per 100% of the area of each of the wires.

3. The suspension board with circuit according to claim 1, further comprising a second insulating base layer interposed between the first metal thin film and the metal supporting board.

* * * * *